United States Patent [19]

Okutsu et al.

[11] Patent Number: 5,148,049
[45] Date of Patent: Sep. 15, 1992

[54] CIRCUIT FOR DRIVING A CAPACITIVE LOAD UTILIZING THYRISTORS

[75] Inventors: Mitsuhiko Okutsu, Katsuta; Kenji Abe, Hitachi; Tadaaki Kariya, Ibaraki, all of Japan

[73] Assignees: Hitachi, Ltd., Tokyo; Hitachi Engineering Ltd., Ibaraki, both of Japan

[21] Appl. No.: 405,230

[22] Filed: Sep. 11, 1989

[30] Foreign Application Priority Data

Sep. 20, 1988 [JP] Japan .................. 63-233433

[51] Int. Cl.$^5$ .................. H03K 3/26; H03K 17/51
[52] U.S. Cl. .................. 307/270; 307/570; 307/268; 307/639
[58] Field of Search .......... 307/270, 246, 630, 639, 307/640, 641, 633, 570, 268; 328/67

[56] References Cited

U.S. PATENT DOCUMENTS

| | | | |
|---|---|---|---|
| 4,581,542 | 4/1986 | Steigerwald | 307/570 X |
| 4,581,543 | 4/1986 | Herberg | 307/630 |
| 4,598,213 | 7/1986 | Marley et al. | 307/246 |
| 4,612,452 | 9/1986 | Stefani et al. | 307/246 |
| 4,692,643 | 9/1987 | Tokunaga et al. | 307/570 X |
| 4,769,561 | 9/1988 | Iwamura et al. | 307/270 |
| 4,810,903 | 3/1989 | Bushey et al. | 307/570 X |
| 4,874,970 | 10/1989 | Coy et al. | 307/246 |
| 4,877,980 | 10/1989 | Kubinec | 307/270 |
| 4,926,065 | 5/1990 | Coy et al. | 307/246 |
| 4,967,100 | 10/1990 | Okutsu et al. | 307/270 |
| 5,003,246 | 3/1991 | Nadd | 307/570 X |

Primary Examiner—Stanley D. Miller
Assistant Examiner—Toan Tran
Attorney, Agent, or Firm—Antonelli, Terry, Stout & Kraus

[57] ABSTRACT

A driving circuit suitable for driving a capacitive load such as an EL display panel is disclosed, which comprises a first power source terminal; a second power source terminal; an output terminal, with which a capacitive load is connected; a source side thyristor connected between the first power source terminal and the output terminal, and supplying current to the load; a sink side thyristor connected between the second power source terminal and the output terminal and drawing-out current from the load; and a control section connected between the first power source terminal and the second power source terminal and ON-OFF controlling the source side thyristor and the sink side thyristor through a circuit arrangement coupled between the control circuit and the gates of the thyristors.

9 Claims, 4 Drawing Sheets

CIRCUIT FOR DRIVING A CAPACITIVE LOAD UTILIZING THYRISTORS

BACKGROUND OF THE INVENTION

The present invention relates to a driving circuit and an EL display device, and in particular to a driving circuit suitable for a high voltage drive of a capacitive load and an EL display device using this driving circuit.

Capacitive loads such as EL panels, piezo-electric elements, and similar driven devices are typically with a high voltage, and a high withstand voltage is required for the driving circuit therefor. Further the driving circuit for the capacitive load should be provided in general with a source side switch for charging the load and a sink side switch for discharging the load, which has been once charged.

For the driving circuit for a capacitive matrix load such as an EL panel, it is desired to integrate a number of output channels, in carrying out this integration, it is an important problem to reduce the electric power consumption in the driving circuit. An example of such a driving circuit, in which a thyristor is used, is disclosed in JP-A-60-208119, with an intention of reducing the electric power consumption and increasing the load current driving power. This is shown in FIG. 6.

In FIG. 6 there are disposed a thyristor 8, whose anode and cathode are connected with a power source terminal 201 and an output terminal 3, respectively; a diode 9, whose cathode and anode are connected with the cathode-gate of the thyristor 8 and the cathode thereof respectively; an NPN transistor 11, whose collector and emitter are connected with the anode-gate of the thyristor 8 and a power source terminal 202 through a resistor 12, respectively; and an NPN transistor 10, whose collector and emitter are connected with the cathode-gate of the thyristor 8 and the power source terminal 202, respectively, which constitute an output section. The bases of the NPN transistors 10 and 11 are connected with the drains of PMOS transistors 72 and 71, respectively, within a buffer circuit 207 driving the output section described above, responding to signals coming from a logic circuit 206. Further the sources of the PMOS transistors 71 and 72 are connected with a low voltage power source terminal 204. The logic circuit 206 controls the buffer circuit 207, responding to the input signal through an input terminal 205 and it can be constructed by a shift register and a latch circuit, or similar circuitry in the case w ere the output section is constructed by integrating a number of channels. The drive of a capacitive load connected with the output terminal 3 will be explained below.

Now it is supposed that the power source terminal 201 is biased by a positive high voltage $V_{HP}$ ground potential GND. In the case where the capacitive load 13 is charged by the positive high voltage $V_{HP}$, the thyristor 8 may be switched-on by turning the NPN transistor 10 to the OFF state. The ON drive of the thyristor 8 is effected by drawing-out the gate driving current through the anode-gate of the thyristor 8 by turning-on the PMOS transistor 71 within the buffer circuit 207 to turn-on the NPN transistor 11. This gate driving current is brought about through the power source terminal 201 biased by the high voltage $V_{HP}$.

Next, in the case where the capacitive load 13, which has been once charged by the high voltage $V_{HP}$, is discharged, the thyristor 8 is turned to the OFF state by turning-on the NPN transistor 10. The NPN transistor 10 is turned-on by turning-on the PMOS transistor 72 within the buffer circuit 207 to supply the base current through the low voltage power source terminal 204. Since, in the circuit indicated in FIG. 6, the discharging current from the capacitive load 13 flows through a diode 9 to the NPN transistor 10, the circuit between the cathode-gate and the cathode of the thyristor 8 is reverse-biased and further the cathode-gate of the thyristor 8 is biased towards the GND side by the NPN transistor 10. In this way it is possible to prevent erroneous operations of the thyristor 8.

A case where the driving circuit indicated in FIG. 6 is applied to the drive of the EL panel scan side electrodes will be explained below.

In the EL panel there are disposed scan side electrodes, to which a high voltage is applied sequentially and selectively, and data side electrodes, to which a relatively low voltage is applied in synchronism therewith, responding to lightening and non-lightening data, which are crossed with each other, an EL layer being formed between the two kinds of electrodes. A part put between a scan side electrode and a data side electrode constitutes a pixel, which is equivalent to a capacitive load. The light emission starting voltage is as high as about 200 (V) as disclosed in JP-A-60-97394. Since the EL panel has the polarization effect, it can be driven by an AC voltage. That is, when an EL element is discharged to emit light after having been once charged with a certain voltage polarity, polarization is produced in the direction, where the voltage polarity applied previously is canceled. Therefore, when it is again charged by applying a voltage of same polarity thereto and made emit light, the brightness of the emitted light is reduced. Consequently, in the case where an EL element, which has been once made emit light, should be made again emit light, it is necessary to apply a voltage having a polarity, which is opposite to preceding one, thereto. As examples describing such a method for driving an EL panel, there are known literatures, e.g. "Bidirectional Push-Pull Symmetrical Driving Method For A TF-EL Display (in Japanese)" Sharp Technical Report, Vol. 38, 1987, etc.

FIG. 7 shows an example, in which a number of channels of the driving circuits indicated in FIG. 6 are integrated and applied to the drive of the scan side electrodes in an EL panel as described above.

In FIG. 7, thyristors 81, 82, . . . , NPN transistors 101, 102, . . . , 111, 112, . . . , resistors 121, 122, . . . , etc. corresponding to the thyristor 8, the NPN transistor 10, 11 and the resistor 12 indicated in FIG. 6 are disposed for every channel, power source terminals 201 and 202 being used in common. An output terminal 31, 32, . . . for each of the channels corresponds to one line of the scan side electrodes. Further each of C1, C2, etc. corresponds to one line of the data side electrodes and each of the capacitive loads 311, 312, etc. connected between the two kinds of electrodes corresponds to one pixel. Hereinbelow the capacitive loads 311, 312, etc. are called pixels 311, 312, etc.

Since the circuit for driving the scan side electrodes applies both positive and negative polarity high voltage signals to the data side electrodes, as described also in the example of literature stated above, the power source lines therefor, i.e. power source terminals 201, 202, 204, etc. in FIG. 7, are floating and control signals are inputted through photo-couplers, etc. Further the potential at the low voltage power source terminal 204 is kept always at about 5 (V) with respect to the potential at the power source terminal 202.

At first the case where charging of the pixel and light emission are effected by applying a positive high voltage $V_{HP}$ to the scan side electrode 31 will be described.

Now it is supposed that the power source terminal 201 is biased by the positive high voltage $V_{HP}$ and the power source terminal 202 by 0 (V) and that the data side electrode C1 is biased by 0 (V) and C2 by a voltage $V_D$. Denoting the light emission starting voltage of the EL pixel by $V_T$, relationships expressed by $V_{HP} > V_T$ and $V_{HP} - V_D < V_T$ are supposed to be valid. In this state the positive high voltage $V_{HP}$ is sent to the scan side electrode 31 by turning-on only the thyristor 81. At this time the voltage between the two terminals of the pixel 311 is $V_{HP}$. Since this voltage exceeds the light emission starting voltage $V_T$, the pixel 311 emits light. On the other hand, since the voltage between the two terminals of the pixel 312 is $V_{HP} - V_D$, and since this voltage does not reach the light emission starting voltage $V_T$, the pixel 312 does not emit light. In this way it is possible to decide emission and non-emission of light by the pixels on the selected scan side electrode (in the case described above scan side electrode 31) by using a relatively low voltage $V_D$ applied to the data side electrode.

After charging of the pixel and emission (or non-emission) of light have been effected by the positive high voltage $V_{HP}$, the pixel is discharged to prepare for the succeeding driving timing. The discharge of the pixels on the scan side electrode 31 can be effected by turning-on the NPN transistor 101. By the procedure described above the drive of the scan side electrode 31 is terminated and the succeeding scan side electrode 32 is selected and driven. When it is terminated in this way to select and drive all the scan side electrodes, the procedure returns to the selection of the first scan side electrode 31. However, because of the polarization effect of the EL pixel, it is necessary to apply at this time a voltage having a polarity opposite to that used at the last time. Therefore, at this time, the power source terminal 202 is biased by a negative high voltage $V_{HN}$ and the power source terminal 201 by 0 (V) so that only the NPN transistor 101 is turned-on to send the negative high voltage $V_{HN}$ to the scan side electrode 31. Here $V_{HN}$ is supposed to satisfy relationships expressed by $|V_{HN}| < V_T$ and $|V_{HN}| + V_D > V_T$.

Now, if it is supposed that the data side electrode C1 is biased by 0 (V) and C2 by the voltage $V_D$, since the voltage between the two terminals of the pixel 311 is $|V_{HN}|$, the voltage does not reach the light emission starting voltage $V_T$ and therefore no light is emitted. On the other hand, for the pixel 312, since the voltage between the two terminals thereof is $|V_{HV}| + V_D$, the voltage applied thereto exceeds the light emission starting voltage $V_T$ and light is emitted.

After charging of the pixel and emission (or non-emission) of light by this negative high voltage $V_{HN}$, the thyristor 81 are turned-on to discharge the pixels on the scan side electrode 31 and the procedure proceeds to the selection of the succeeding scan side electrode 32.

In the example of literature stated above the method, by which the polarity of the applied voltage is inverted for every scanning electrode, is used. In any case, viewed from a certain scanning electrode, the polarity of the voltage is inverted for every time to select and drive the pixel. For this reason the voltages applied to the power source terminal 201 and 202 are switched over by an external switching element.

In the prior art circuit the ON driving current for the thyristor 8, i.e. the gate driving current, flows from the power source terminal 201 through the PNP transistor 11 to the power source terminal 202. At this time, since the power source terminal 201 is at a potential higher than that at the power source terminal 202, this gives rise to a problem that electric power consumption due to the gate driving current is great. Regarding this point it is possible also to intend to reduce effectively the gate driving current of the thyristor 8 to decrease the electric power consumption by disposing a one-shot circuit within the logic circuit 206 and by pulse-driving a PMOS transistor 71 and an NPN transistor 11. However this causes complication of the logic circuit, which in turn gives rise to increase in the chip area. Further, in the case of this pulse-driving, after the thyristor 8 has been once turned-on, since there exists no more gate current, when the current flowing through the thyristor 8, i.e. pixel charging current, decreases below the holding current of the thyristor 8, the thyristor 8 is turned-off, which gives rise also to a problem that the charging voltage of the pixel is lowered. In addition, in the case where a number of channels are integrated as indicated in FIG. 7, by the construction of the prior art circuit, since a high potential difference is produced between the power source terminals 201 and 202, if short-circuit takes place between different output terminals at the exterior, short-circuit current flows through the path of power source terminal 201—source side switching element (e.g. thyristor 81) —sink side switching element (e.g. NPN transistor 102)—power source terminal 202 between different channels. That is, this can take place e.g. in the case where the scan side electrode 31 is selected, to which the high voltage $V_{HP}$ is applied and the other scan side electrodes 32, . . . are at 0V, so that the NPN transistors 102, . . . , etc. are turned-on. In order to limit the short-circuit current stated above and to prevent the destruction of the integrated circuit, the source side or the sink side switching element should have the current limiting function. In the examples indicated in FIGS. 6 and 7, the NPN transistor used on the sink side carries out this function.

As explained above, in the prior art circuit, in some cases the load driving current power should be limited. This gives rise to a problem, when it is applied to an EL display device, where required current driving power increases with increasing size of the panel.

SUMMARY OF THE INVENTION

The object of the present invention is to provide a driving circuit capable of solving the problem described above and suitable for driving a capacitive load and more concretely speaking, capable of reducing electric power consumption without complicating the circuit and eliminating the holding current of a thyristor, when it is used.

The above object can be achieved by so constructing the driving circuit that there are disposed a source side switching element between a first power source terminal and the output terminal and a sink side switching element between the output terminal and a second power source terminal, the first power source terminal being held at a potential higher than the second power source terminal by a predetermined potential and when one of the two power source terminals is connected with a positive high voltage power source, a negative high voltage power source or an earth potential, the other is held in a floating state. The predetermined potential described above has a value, which is sufficient for driving a control section ON-OFF controlling the source side and the sink side switching element and which is lower than the voltage of the high voltage power source.

When the positive high voltage $V_{HP}$ is sent to the output terminal, the positive high voltage $V_{HP}$ is applied to the first power source terminal and the second power source terminal is held in the floating state so as to turn-on the source side switching element. Since a potential difference of about 5 (V) is always necessary between the first power source terminal and the second power source terminal, taking the voltage drop in the control section into account, the potential at the second power source terminal is lower than the positive high potential $V_{HP}$ at the first power source terminal by about 5 (V). The ON driving current for the source side switching element such as a thyristor can be obtained by making current flow from the first power source terminal to the second power source terminal. In this way it is possible to reduce remarkably the electric power consumption. For this reason the problem of the electric power consumption can be solved without using any means for pulse driving described above. Furthermore it is possible to remove the problem of the holding current, in the case where a thyristor is used, by continuing to make the ON driving current flow during a necessary period.

When the negative high voltage $V_{HN}$ is sent to the output terminal, the negative high voltage $V_{HN}$ is applied to the second power source terminal and the first power source terminal is held in the floating state so as to turn-on the sink side switching element. Since the ON driving current for the sink side switching element can be supplied from the first power source terminal just as by the prior art method, the electric power consumption is small.

As described above, either one of the source side and the sink side switching element can be driven by a low voltage power source. Therefore, in the case where a transistor is used as the switching element, since the driving current, i.e. the base current therefor, can be set so as to be great, it is possible to increase the load current driving power of the switching element. Further, since when the high voltage is applied to either one of the first power source terminal and the second power source terminal, the other is in the floating state, the whole driving circuit is raised or lowered to the potential of the applied high voltage. In the case where the driving circuit is constructed by integrating a number of channels, even if the output terminals of adjacent channels are short-circuited at the exterior, no short-circuit current of the high voltage power source flows in the driving circuit, but only the loads connected with the short-circuited output terminals are driven simultaneously. For this reason neither the source side nor the sink side switching element should have any particular current limiting function and therefore it is possible to increase easily the current driving power both at the source side and at the sink side by using thyristors for both the switching elements.

DESCRIPTION OF THE PREFERRED EMBODIMENTS

Hereinbelow the present invention will be explained, referring t the drawings indicating the preferred embodiments.

Figure 1:
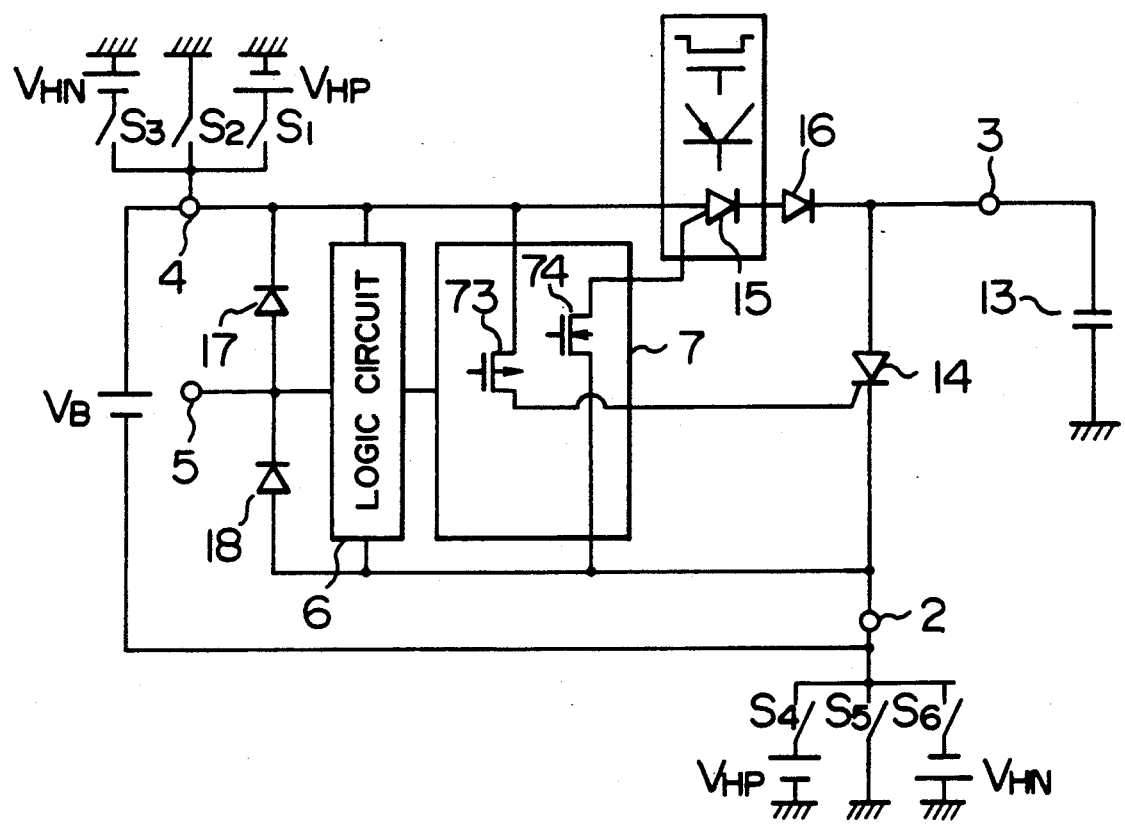
FIG. 1 is a schematic circuit diagram showing an embodiment of the driving circuit according to the present invention.
Figure 6:
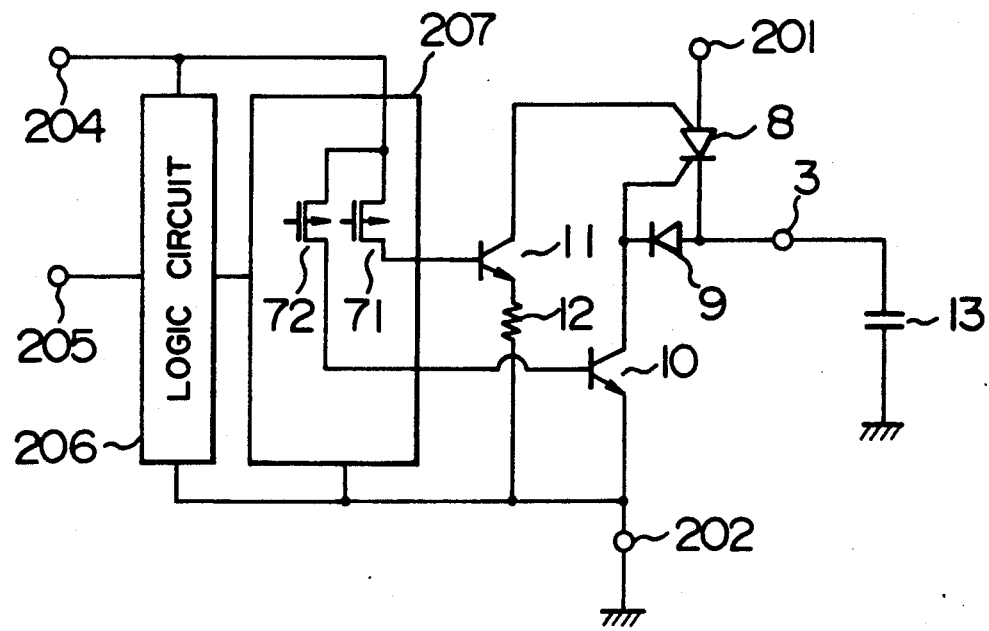
FIG. 6 is a schematic circuit diagram of a prior art driving circuit.

In FIG. 1, there are disposed a thyristor 15 as the source side switching element, in which the anode in connected with a power source terminal 4 and the cathode is connected with the anode of a diode 16, whose cathode is connected with the output terminal 3; and a thyristor 14 as the sink side switching element, in which the anode is connected with the output terminal 3 and the cathode is connected with the other power source terminal 2, these element constituting an output section. The cathode-gate of the thyristor 14 is connected with the drain of a PMOS transistor 73 within a buffer circuit 7 and the source of the PMOS transistor 73 is connected with the power source terminal 4. The anode-gate of the thyristor 15 is connected with the drain of an NMOS transistor 74 with the buffer circuit 7 and the source of the NMOS transistor 74 is connected with the power source terminal 2. Further there is disposed a logic circuit 6 for controlling the buffer circuit 7 and the output section, responding to the input signal through the input terminal 5. Still further there are disposed a diode 17, in which the anode is connected with the input terminal 5 and the cathode is connected with the power source terminal 4, and another diode 18, in which the anode is connected with the power source terminal 2 and the cathode is connected with the input terminal 5. A capacitive load 13 is connected with the output terminal 3. A low voltage power source $V_B$ connected between the power source terminals 2 and 4. The low voltage power source $V_B$ is a floating power source insulated by means of a transformer, etc. and holds the output terminal 4 at a potential, which is always higher than that at the power source 2 by about 5 V. The power source terminal 4 is connected with a positive high voltage power source $V_{HP}$ through an external switching element $S_1$, with the earth potential through a switching element $S_2$; and with a negative high voltage power source $V_{HN}$ through an external switching element $S_3$. On the other hand the power source terminal 2 is connected with a positive high voltage power source $V_{HP}$ through an external switching element $S_4$; with the earth potential through a switching element $S_5$; and with a negative high voltage power source $V_{HN}$ through an external switching element $S_6$. Furthermore, the control signal inputted through the input terminal 5 is inputted through an isolator such as a photo-coupler. Now the operation of the driving circuit will be explained below.

At first, in the case where the positive high voltage $V_{HP}$ is sent to the output terminal 3, in the state where the external switching element $S_1$ is turned-on and the other external switching elements $S_2$, $S_3$, $S_4$, $S_5$ and $S_6$ are turned-off, the thyristor 15 is turned-on. The thyristor 15 can be turned-on by turning-on the NMOS transistor 74 within the buffer circuit 7 and by drawing-out the gate driving circuit from the anode-gate thereof. Since this gate driving current is supplied by the low voltage power source $V_B$ and flows between the power source terminals 4 and 2, the electric power consumption is small. The charging current to the capacitive load 13 flows through the path of power source terminal 4— thyristor 15—diode 16—capacitive load 13—GND.

In the case where the capacitive load 13 charged by the positive high voltage $V_{HP}$ is discharged, in the state where the external switching elements $S_1$, $S_2$, $S_4$, $S_3$, and $S_6$ are turned-off and the external switching element $S_5$ is turned-on, the thyristor 14 is turned-on. The thyristor 14 can be turned-on by turning-on the PMOS transistor 73 within the buffer circuit 7 and by supplying the gate driving current to the cathode gate. Since this gate driving current is supplied also by the low voltage power source $V_B$ and flows between the power source terminals 4 and 2, the electric power consumption is small. The discharging current from the capacitive load 13 flows through the thyristor 14 to the power source terminal 2.

Next, in the case where the capacitive load 13 is charged by the negative high voltage $V_{HN}$, the external switching elements $S_1$, $S_2$, $S_3$, $S_5$ and $S_4$ are turned-off; the external switching element $S_6$ is turned-on; and the negative high voltage $V_{HN}$ is applied to the power source terminal so that the thyristor 14 is turned-on. When the thyristor 14 is turned-on, the charging current flows from the capacitive load 13 to the power source terminal 2 and the capacitive load 13 is charged by the negative high voltage $V_{HN}$. At this time the gate driving current of the thyristor 14 is supplied by the low voltage power source $V_B$ similarly to the above description and flows between the power source terminals 4 and 2.

In the case where the capacitive load 13 charged by the negative high voltage $V_{HN}$ is discharged, the external switching elements $S_1$, $S_3$, $S_4$, $S_5$ and $S_6$ are turned-off; the external switching element $S_2$ is turned-on so that the power source terminal 4 is biased at 0 (V); and the thyristor 15 is turned-on. Just as described in the above, the thyristor 15 can be turned-on by turning-on the PMOS transistor 74 so that the gate driving current flows from the power source terminal 4 to the power source terminal 2. By turning-on the thyristor 15 the discharging current for the capacitive load 13 flows from the power source terminal 4 to be capacitive load 13 through the thyristor 15 and the diode 16.

Further, in the present embodiment, it is possible also to charge and discharge the capacitive load 13 only through either one of the power source terminals 2 and 4. For example, in the case where the load is charged and discharged only through the power source terminal 2, when current is supplied to the capacitive load 13, i.e. at the charging there of by the positive high voltage $V_{HP}$ or at the discharge after having charged it by the negative high voltage, the current can flow from the power source terminal 2 through the path of diode 18—diode 17—thyristor 15—diode 16—output terminal 3. On the other hand, in the case where current is drawn out from the capacitive load 13, just as explained in the above embodiment, the thyristor 14 may be turned-on.

In the case where only the power source terminal 4 is used, it is possible to charge and discharge the capacitive load 13 similarly by using the path of the diodes 18 and 17.

As described above, in the case where a terminal is used in common for applying the high voltage either one of the groups of the external switching elements $S_1$, $S_2$, $S_3$ and $S_4$, $S_5$, $S_6$ in FIG. 1 can be removed.

Further, according to the present embodiment, since the positive and negative high voltage drive of the capacitive load 13 is possible and in addition it is possible to control both the source side switching element and the sink side switching element by means of a low voltage system of about 5 V, it is possible to reduce remarkably the electric power consumption for driving the high voltage switching elements and to obtain a driving circuit, which is advantageous for the integration. In FIG. 1, although the thyristors 14 and 15 are used as the switching elements in order to increase the load driving current power, an identical operation can be carried out, even if the switching elements are constituted by PNP transistors or MOS transistors. However, in the case where PNP transistors are used therefor, a base current, which is generally greater than the gate driving current for the thyristor, is required and also from the point of view of the load current driving power it is more advantageous to use the thyristors therefor. In the case where the thyristors are used therefor, although the holding current gives rise to a problem, according to the present embodiment, since an effect of reducing remarkably the electric power consumption due to the gate driving current can be obtained, this problem can be solved by continuing to make the gate current flow during a necessary period of time. In general, since the intensity of the gate current necessary for turning-on the thyristor is about 100 ($\mu$A) to several hundreds of ($\mu$A), supposing that the potential difference between the power source terminals 2 and 4 in FIG. 1 is 5 (V), the electric power consumption due to the gate driving current is approximately equal to 100 ($\mu$A)$\times$5 (V)=0.5 (mW), which is extremely small. Here the thyristors 14 and 15 and the diode 16 are high withstand voltage elements and the thyristor 14 has a high withstand voltage in both the directions, forward and backward. Further, in the case where the logic circuit 6 is constructed by CMOS transistors, the diodes 18 and 17 are disposed generally as input gate protecting elements, which may be utilized therefor.

As explained above, since it is possible to drive the capacitive load by using both the positive and the negative high voltage owing to the fact that either one of the power source terminals 2 and 4 is in the floating state, the present embodiment is the most suitable for the EL panel scan side driving circuit driven while setting the power source line in the floating state.

Figure 2:
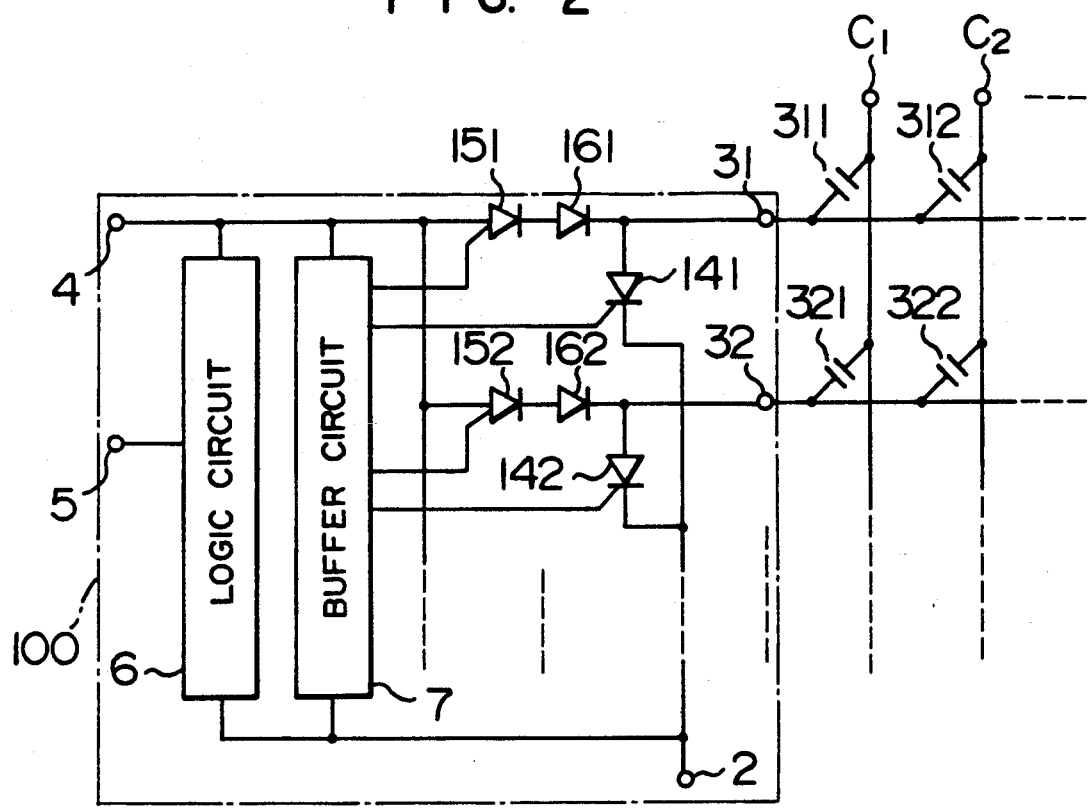
FIG. 2 is a schematic circuit diagram of an EL display element using the driving circuit indicated in FIG. 1.

FIG. 2 illustrates an example, in which the driving circuit indicated in FIG. 1 as an embodiment of the present invention is applied to drive of the EL panel scan side electrodes. In this figure, means for giving the power source terminals the potentials are omitted.

In FIG. 2 a number of the driving circuits indicated in FIG. 1, which is equal to the number of channels, are disposed and the output terminal 31, 32, . . . , and so forth of each of the channels is connected with one scan side electrode in the EL display panel, the number of driving circuits being formed on a same semiconductor substrate 100. Further $C_1, C_2, \ldots$, etc. represent data side electrodes and a point, where a scan side electrode and a data side electrode, which are disposed on the different sides of the EL layer, cross each other, corresponds to an EL pixel 311, 312. Further in the used state either one of the power source terminals is in the floating state the power source terminal 4 is held at a potential higher than the potential at the power source terminal 2 by about 5 (V).

Since the EL display panel has the polarization effect as described above, the polarity of the applied voltage is inverted every time to effect the light emission of the pixel. In FIG. 2, in the case where the scan side electrode 31 is selected and charged by the positive high voltage $V_{HP}$ to make the pixel emit light, the positive high voltage $V_{HP}$ is applied to the power source terminal 4, the power source terminal 2 being in the floating state. If there is a current path from the power source terminal 2 towards the power source terminal 4 such as the diodes 18 and 17 indicated in FIG. 1, the voltage may be applied to either one of the power source terminals 2 and 4. The positive high voltage $V_{HP}$ is sent to the scan side electrode 31 by turning-on only the thyristor 151, in the state where the positive high voltage $V_{HP}$ is applied to the power source terminal 4. At this time the pixels 311, 312, . . . , etc. on the scan side electrode 31 can be made emit light, depending on the potential state of the data side electrodes $C_1, C_2, \ldots$, etc.

Next, in the case where the pixels 311, 312, . . . , etc. on the scan side electrode 31 are discharged, the power source terminal 4 is set in the floating state; the power source terminal 2 is biased by 0 (V); and the thyristor 141 is turned-on. The discharging current flows from the scan side electrode 31 to the power source terminal 2 through the thyristor 141.

By the procedure described above the selection of the scan side electrode 31 is terminated and it proceeds to the selection of the succeeding scan side electrode 32. After all the scan side electrodes have been successively selected, the procedure returns again to the selection of the scan side electrodes 31, at this time, in order to invert the polarity of the voltage applied to the pixels, the negative high voltage $V_{HN}$ should be sent from the output terminal. In this case the power source terminal 4 is set in the floating state, the negative high voltage $V_{HN}$ is applied to the power source terminal 2; and only the thyristor is turned-on. The negative high voltage $V_{HN}$ is sent to the scan side electrode 31 by turning-on the thyristor 141 and the pixels 311, 312, . . . , etc. on the scan side electrode 31 can be made emit light, depending on the potential state of the data side electrodes $C_1, C_2, \ldots$, etc.

Next, in the case where the pixels 311, 312, . . . , etc. are discharged, the power source terminal 2 is set in the floating state; the power source terminal 4 is biased by 0 (V), and the thyristor 151 is turned-on. The discharging current flows from the power source terminal 4 to the scan side electrode 31 through the thyristor 151 and the diode 161 and can discharge the pixels 311, 312, . . . , etc. on the scan side electrode 31.

As explained above, according to the present embodiment, it is possible to drive the scan electrodes in an EL panel. The scanning electrode is composed of generally more than several hundreds of lines and it is necessary for the driving circuit to integrate a number of channels.

Since the present invention has the effect of reducing remarkably the electric power consumption, it is very advantageous for the integration. Further recently the EL panel has a tendence to become larger and larger. Since the load current increases therewith, the current driving power of the driving circuit gives rise to a problem. By using thyristors as described in the present embodiment, it is possible to fulfill the requirement stated above without increasing the electric power consumption and to obtain the driving circuit the most suitable for the scan electrode drive of the EL panel.

Figure 3:
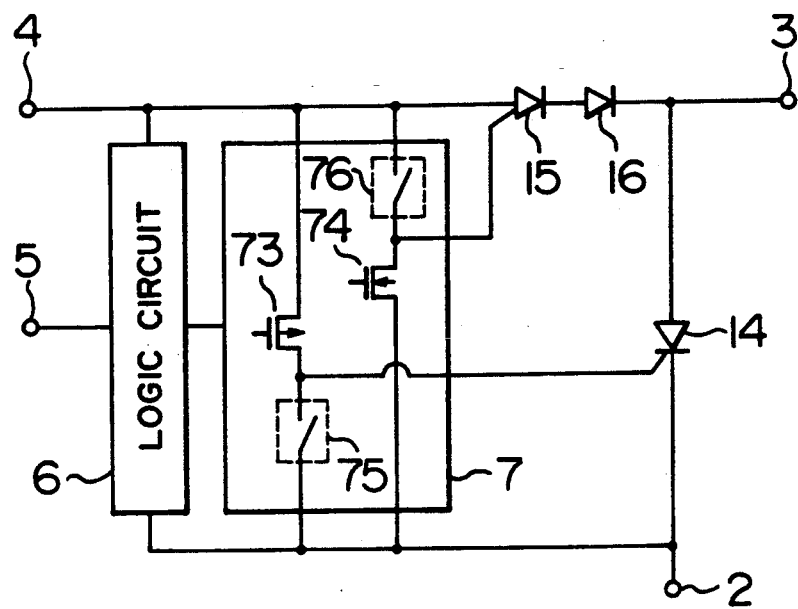
FIG. 3 is a schematic circuit diagram showing another embodiment of the driving circuit according to the present invention.

FIG. 3 shows another embodiment of the present invention.

In FIG. 3, in addition to the embodiment indicated in FIG. 1, there are disposed a switching element 76 between the anode and the anode-gate of the thyristor 15 and another switching element 75 between the cathode and the cathode-gate of the thyristor 14. Concerning the ON drive of the thyristors 14 and 15, they can be turned-on by means of the PMOS transistor 73 or the NMOS transistor 74 just as described in the embodiment indicated in FIG. 1, while setting the switching elements 75 and 76 in the OFF state. In the present embodiment the means for giving the power source terminals 2 and 4 the potentials are identical to those described in the embodiment indicated in FIG. 1 and therefore they are omitted. Now the effect obtained by disposing the switching elements 75 and 76 will be explained.

In general, in order to secure the reliability concerning the withstand voltage of the thyristor, a resistor is inserted between the cathode-gate and the cathode or the anode-gate and the anode thereof. Further, for the transistor, a resistor is inserted between the base and the emitter. Although this resistor can prevent erroneous operations better with decreasing resistance, since the leak current flowing through this resistor increases correspondingly, which increases the gate driving current or the base current. Further the thyristor has a property of being erroneously lightened by the fact that the rise rate of the applied voltage, i.e. dv/dt, is great. Also in order to prevent this phenomenon, a measure for preventing the erroneous operation of the thyristors is taken by bypassing the current flowing through the junction at the application of dv/dt by using the resistor. In this case also, it is possible to prevent better erroneous operations against dv/dt with the decreasing resistance.

The embodiment indicated in FIG. 3 can prevent erroneous operations of the thyristors 14 and 15 without increasing the gate driving current by disposing the switching elements 75 and 76. For example, in the case where the positive high voltage $V_{HP}$ is applied to the power source terminal 4 and the thyristor 15 is held in the OFF state, the switching element 76 is turned-on. In this way, since the anode and the anode-gate of the thyristor 15 are short-circuited, it is possible to prevent erroneous operations of the thyristor 15. Further, in the case where the negative high voltage $V_{HN}$ is applied to the power source terminal 2 and the thyristor 14 is held in the OFF state, the cathode-gate and the cathode are short-circuited by turning-on the switching element 75 and it is possible to prevent erroneous operations.

Since both the switching elements 75 and 76 can be driven between the power source terminals 4 and 2, it is not necessary to use high withstand voltage elements and therefore the driving circuit can be constructed by using e.g. low voltage MOS transistors, etc. For this reason it is never disadvantageous to form the switching elements in an integrated circuit.

According to the present embodiment an effect can be obtained that it is possible to prevent easily erroneous operations of the driving circuit in addition to the effect obtained in the embodiment indicated in FIG. 1 and previously explained.

Also in this embodiment, as indicated in FIG. 2, the output terminal 3 can be connected with each of the scan electrodes in the EL display device.

Figure 4:
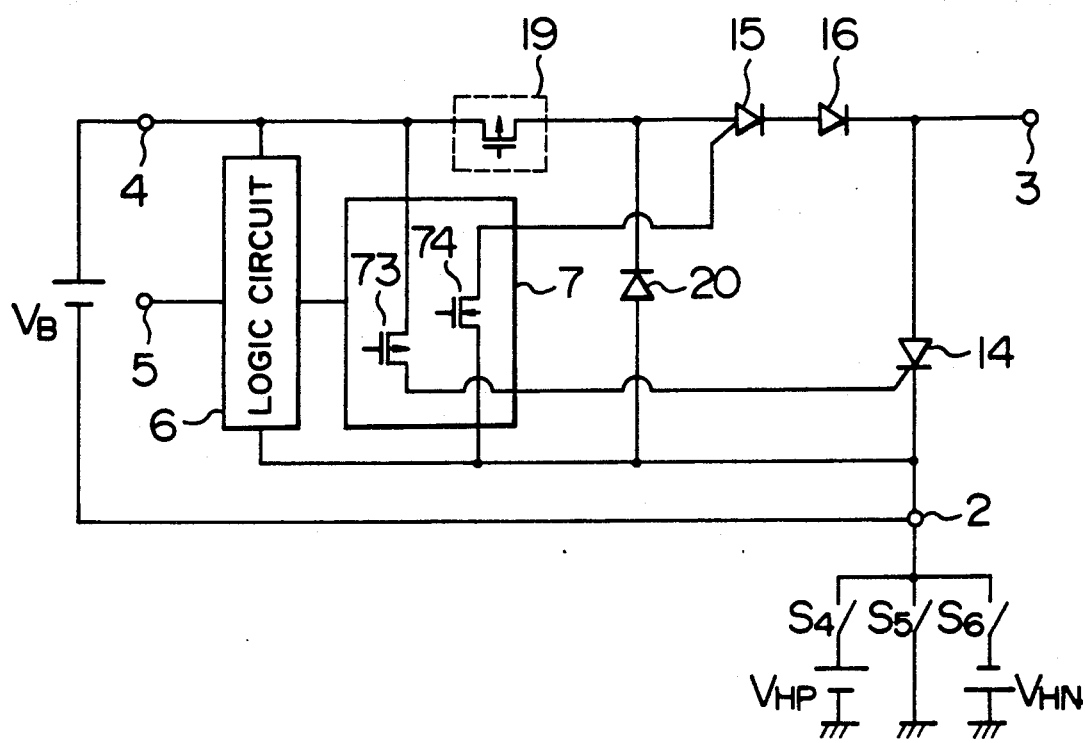
FIG. 4 is a schematic circuit diagram showing still another embodiment of the driving circuit according to the present invention.

FIG. 4 shows still another embodiment of the present invention.

In FIG. 4, in addition to the embodiment indicated in FIG. 1, there are disposed a switching element 19 between the power source terminal 4 and the anode of the thyristor 15 and a diode 20, in which the cathode is connected with the anode of the thyristor 15 and the anode with the power source terminal 2. It differs from the embodiment indicated in FIG. 1 in that there exist means for giving the power source terminals the potentials only on the power source terminal 2 side. Hereinbelow the operation thereof will be explained.

At first, in the case where the positive high voltage $V_{HP}$ sent to the output terminal 3, the external switching element $S_4$ is turned-on; the positive high voltage $V_{HP}$ is applied to the power source terminal 2; and the thyristor 15 is turned-on. The thyristor 15 can be turned-on owing to the fact that the gate driving current flows from the power source terminal 4 to the power source terminal 2 through the switching element 19 and the NMOS transistor 74 by turning-on the switching element 19 and the NMOS transistor 74. Further, just as described previously, the power source terminal 4 is held always at a potential higher than that at the power source terminal 2 by about 5 (V) by means of the low voltage power source $V_B$. When a capacitive load is connected with the output terminal 3 the capacitive load can be charged up by the positive high voltage $V_{HP}$ from the power source terminal 2 through the diode 20, the thyristor 15 and the diode 16. In the case where there exists no diode 20, if the positive high voltage $V_{HP}$ is applied to the power source terminal 4 while holding the power source terminal 2 in the floating state, or if there exists a path (diode path) from the power source terminal 2 towards the power source terminal 4, as indicated in FIG. 1, the charging of the load can be effected in the same way. However, in this case, since the charging current flows through the switching element 19, a current capacity for the switching element 19 is required. In the case where the load charged by the positive high voltage $V_{HP}$ is discharged, the external switching element $S_5$ is turned-on; the power source terminal 2 is biased by 0 (V); and the thyristor 14 is turned-on. The thyristor 14 is turned-on by turning-on the PMOS transistor 73 to supply the gate driving current from the power source terminal 4 thereto. At this time, if the thyristor 15 is still in the ON state, both the thyristors 15 and 14 are in the ON state, which causes the short-circuit between the power source terminals 4 and 2.

In the present embodiment this problem is solved by disposing the switching element 19. That is, when the thyristor 14 side is going to be turned-on, the current path from the power source terminal 4 to the power source terminal 2 through the thyristors 15 and 14 is cut-off by turning-off the switching element 19 and in this way the short-circuit described above can be prevented. Since it is sufficient for the switching element 19 to make a current approximately equal to the gate driving current of the thyristor 15 flow therethrow and it can be composed of a low voltage element, it may be formed by a PMOS transistor, etc. Further, in the case where the circuit indicated in FIG. 4 including a number of channels is formed in an integrated circuit, the thyristor 15, etc. may be disposed by using the cathode side of the diode 20 as the common terminal.

According to the present embodiment an effect can be obtained that it is possible to prevent easily erroneous operations of the driving circuit in addition to the effect obtained in the embodiment indicated in FIG. 1.

Figure 5:
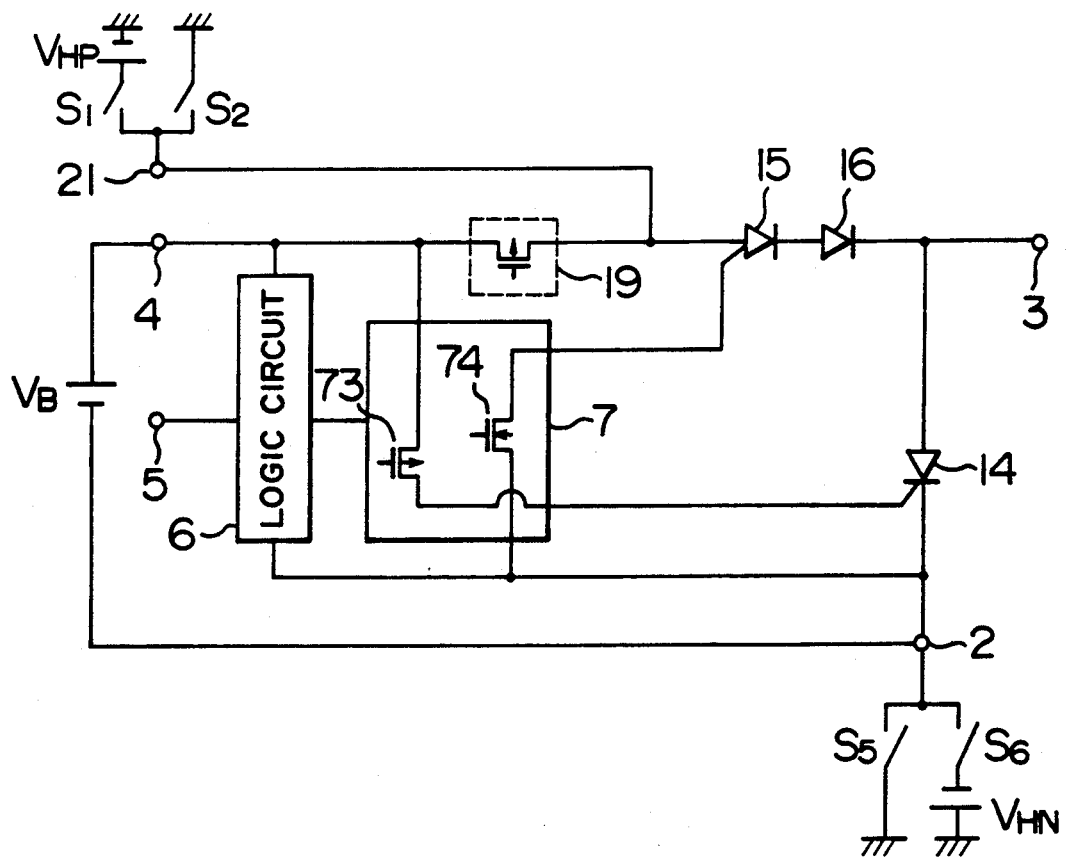
FIG. 5 is a schematic circuit diagram sowing a different embodiment of the driving circuit according to the present invention.
Figure 7:
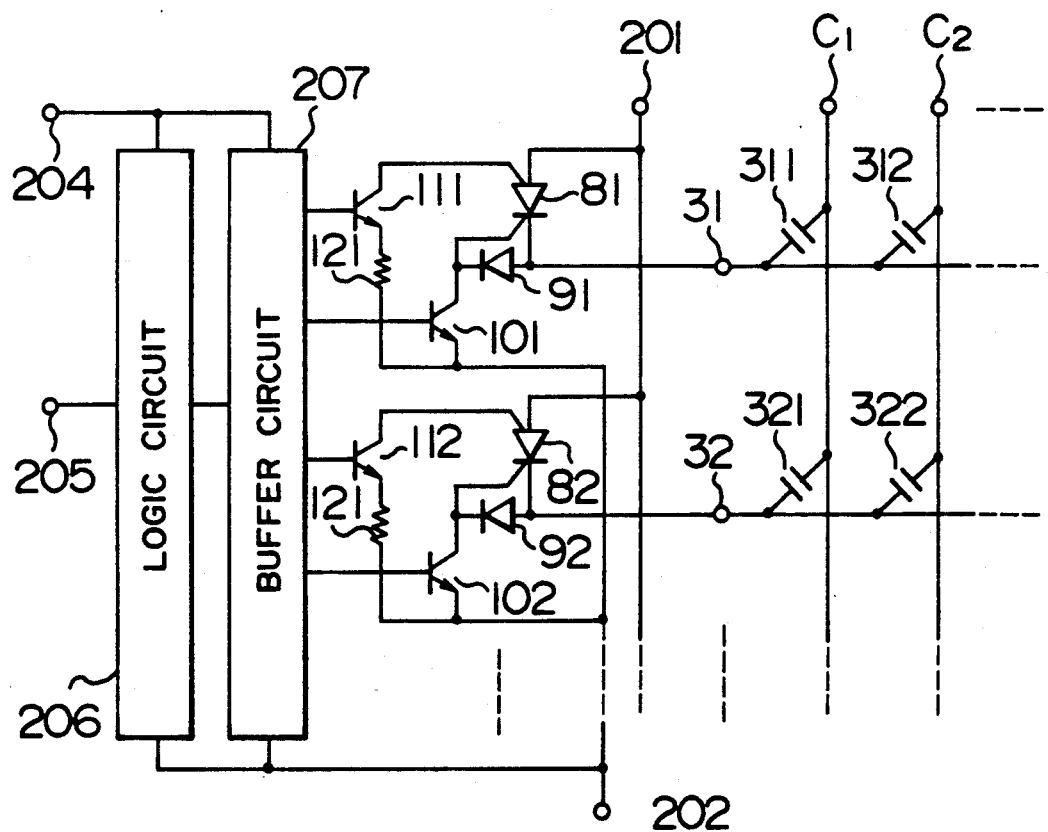
FIG. 7 is a schematic circuit diagram of an EL display device using the prior art driving circuit indicated in FIG. 6.

FIG. 5 shows a different embodiment of the present invention.

In FIG. 5, the diode 20 in FIG. 4 is removed and a power source terminal 21 is disposed between the switching element 19 and the thyristor 15 instead thereof. The power source terminal 2 is connected with the earth potential and the negative high voltage power source $V_{HN}$ through the external switching elements $S_5$ and $S_6$, respectively. On the other hand the power source terminal 21 is connected with the positive high voltage power source $V_{HP}$ and the earth potential through external switching elements $S_1$ and $S_2$ respectively.

In FIG. 5, in the case where the positive high voltage $V_{HP}$ is sent to the output terminal 3, the external switching element $S_5$ and $S_6$ is turned-off so that the power source terminal 2 is in the floating state and the external switching element $S_1$ is turned-on so that the positive high voltage $V_{HP}$ is applied to the power source terminal 21. In this state the thyristor thyristor 15 is turned-on. The thyristor 15 is turned-on owing to the fact that the driving current flows from the power source terminal 4 to the power source terminal 2 through the switching element 19 and the NMOS transistor 74 by turning-on both the switching element 19 and the NMOS transistor 74 similarly to that described previously.

In the case where the capacitive load connected with the output terminal 3 and charged by the positive high voltage $V_{HP}$ is discharged or in the case where the capacitive load is charged by the negative high voltage $V_{HN}$, the power source terminal 21 is set in the floating state; the power source terminal 2 is biased by 0 V or by the negative high voltage $V_{HN}$; and the thyristor 14 side may be turned-on similarly to that described previously.

According to the present embodiment, an effect similar to that obtained in the embodiment indicated in FIG. 4 described previously can be obtained by disposing the switching element 19.

The driving circuits indicated in FIG. 4 and 5 can be applied also to the EL display device, as indicated in FIG. 2.

According to the present invention, since both the control currents for the source side switching element feeding the load with current and the sink side switching element drawing-out current from the load can be fed and controlled from the low voltage power source, it is possible to obtain an advantageous circuit for driving a capacitive load, capable of reducing remarkably the electric power consumption and being formed in an integrated circuit. Further, when this driving circuit is applied to the drive of an EL display device it is possible to obtain an EL display device having a small electric power consumption and a high current driving power.

We claim:

1. A driving circuit comprising:

13

1. A driving circuit comprising:
a first power source terminal;
a second power source terminal;
an input terminal;
an output terminal, with which a capacitive load is connected;
a source side thyristor having first and second main current terminals and an anode gate terminal, and supplying current to said load;
a sink side thyristor having first and second main current terminals and a cathode gate terminal, and drawing-out current from said load; and
a control section connected between said first power source terminal and said second power source terminal,
wherein said first main current terminal of said source side thyristor is connected with aid first power source terminal, said second main current terminal of said source side thyristor is connected with aid output terminal through a PN junction element, and said anode gate terminal of said source side thyristor is connected with said first power source terminal thereof through a first switching element and with said power source terminal thereof through a second switching element, and wherein said first main current terminal of said sink side thyristor is connected with said output terminal, said second main current terminal of said sink side thyristor is connected with said second power source terminal, and said cathode gate terminal of said sink side thyristor is connected with said first power source terminal through a third switching element and with said second power source terminal through a fourth switching element, respectively,
wherein said control section is connected with said first, second, third and fourth switching elements and said input terminal so that said first, second, third and fourth switching elements are each controlled by said control section in response to an input signal on said input terminal, and
wherein aid first power source terminal is held at a potential higher than said second power source terminal, and the potential difference between said two power source terminals is sufficiently great to drive said control section.

2. A driving circuit according to claim 1, wherein said first, second, third and fourth switching elements are MOS transistors.

3. A driving circuit comprising:
a first power source terminal;
a second power source terminal;
an output terminal, with which a capacitive load is connected;
a source side thyristor having first and second main current terminals and a gate terminal, and supplying current to said load; and
a sink side thyristor having first and second main current terminals and a gate terminal, and drawing-out current from said load,
wherein said source side thyristor has its first main current terminal connected with said first power source terminal, its second main current terminal connected with said output terminal through a semiconductor element, and its gate terminal connected with said second power source terminal through a first gate current control means, wherein said sink side thyristor has its first main current terminal connected with said output terminal, its

14 second main current terminal connected with aid second power source terminal, and its gate terminal connected with said first power source terminal through a second gate control means, and wherein a current bypassing means is connected between said second power source terminal and said first main current terminal of said source side thyristor, said current bypassing means providing a main current flow path between said second power source terminal and said firs main current terminal of said source side thyristor.

4. A driving circuit according to claim 3, wherein said current bypassing means is a diode.

5. A driving circuit comprising:
a first power source terminal;
a second power source terminal;
an output terminal, with which a capacitive load is connected;
a source side thyristor having first and second main current terminals and a gate terminal, and supplying current to said load; and
a sink side thyristor having first and second main current terminals and a gate terminal, and drawing-out current from said load;
wherein said source side thyristor has its first main current terminal connected with said first power source terminal through a switching element, its second main current terminal connected with said output terminal through a semiconductor element, and its gate terminal connected with said second power source terminal through gate control means, wherein said sink side thyristor has its first main current terminal connected with said output terminal, its second main current terminal with said second power source terminal, and its gate terminal with said first power source terminal through gate control means, and wherein a third power source terminal is connected between said switching element and said first main current terminal of said source side thyristor.

6. A driving circuit comprising:
a first power source terminal;
a second power source terminal;
an input terminal;
an output terminal, with which a capacitive load is connected;
a source side thyristor, having a gate terminal, connected between said first power source terminal and said output terminal, and supplying current to said load;
a sink side thyristor, having a gate terminal, connected between said second power source terminal and said output terminal, and drawing-out current from said load;
a buffer section connected between said first power source terminal and said second power source terminal and having a first switching element connected between said gate terminal of said source side thyristor and said second power source terminal, and a second switching element connected between said gate terminal of said sink side thyristor and said first power source terminal, and
a control section connected between said first power source terminal and said second power source terminal and connected to said first and second switching elements and to said input terminal for ON-OFF controlling said first switching element and said second switching element, in response to an input signal on said input terminal, wherein when one of said first and said second power source terminals is connected with either one of a positive high voltage power source, a negative high voltage power source and a ground potential, the other is in a floating state, and wherein the potential difference between said first and said second power source terminals is sufficiently great for said control section to be driven.

7. A driving circuit according to claim 6, wherein said capacitive load is an EL display panel.

8. A driving circuit comprising:

a first power source terminal capable of being in a floating state;

a second power source terminal, which is held at a predetermined potential with respect to the potential at said first power source terminal;

an output terminal, with which a capacitive load is connected;

a source side thyristor having first and second main current terminals and a gate terminal, and supplying current to said load; and a sink side thristor, having first and second main current terminals and a gate terminal, and drawing-out current from said load;

wherein said source side thyristor has its first main current terminal connected with said second power source terminal through a switching element, its second main current terminal connected with said output terminal through a semiconductor element, and its gate terminal connected with said first power source terminal through gate control means, wherein said sink side thyristor has its first main current terminal connected with said output terminal, its second main current terminal connected with said first power source terminal, and its gate terminal connected with said second power source terminal through gate control means, and wherein a current bypassing mean sis connected between said first power source terminal and said first main current terminal of said source side thyristor, said current bypassing means providing a main current flow path between said second power source terminal and said first main current terminal of said source side thyristor, and wherein at least two of a positive and a negative high voltage power source and a ground potential are switched over to be connected with said first power source terminal.

9. A driving circuit comprising:

a first power source terminal capable of being in a floating state;

a second power source terminal, which is held at a predetermined potential with respect to the potential at said first power source terminal;

an output terminal, with which a capacitive load is connected;

a source side thyristor having first and second main current terminals and a gate terminal, and supplying current to said load; and a sink side thyristor having first and second main current terminals and a gate terminal, and drawing-out current from said load;

wherein said source side thyristor has its first main current terminal connected with said second power source terminal, its second main current terminal connected with said output terminal through a semiconductor element, and its gate terminal connected with said first power source terminal through gate control means; wherein said sink side thyristor has its first main current terminal connected with said output terminal, its second main current terminal connected with said first power source terminal, and its gate terminal connected with said second power source terminal through gate control means, and wherein one of said first and said second power source terminals is connected with one of a positive high voltage power source, a negative high voltage power source and the earth potential, the other is held in a floating state.

* * * * *